US011775527B2

(12) United States Patent
Meiyyappan et al.

(10) Patent No.: US 11,775,527 B2
(45) Date of Patent: *Oct. 3, 2023

(54) STORING DERIVED SUMMARIES ON PERSISTENT MEMORY OF A STORAGE DEVICE

(71) Applicant: Oracle International Corporation, Redwood Shores, CA (US)

(72) Inventors: Krishnan Meiyyappan, Fremont, CA (US); Semen Ustimenko, Sunnyvale, CA (US); Adrian Tsz Him Ng, Redwood City, CA (US); Kothanda Umamageswaran, Sunnyvale, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/356,827

(22) Filed: Jun. 24, 2021

(65) Prior Publication Data
US 2021/0326343 A1    Oct. 21, 2021

Related U.S. Application Data

(63) Continuation of application No. 15/721,328, filed on Sep. 29, 2017, now Pat. No. 11,086,876.

(51) Int. Cl.
| G06F 16/00 | (2019.01) |
| G06F 16/2455 | (2019.01) |
| G06F 7/08 | (2006.01) |
| G06F 16/22 | (2019.01) |
| G11C 16/10 | (2006.01) |
| G11C 5/14 | (2006.01) |

(52) U.S. Cl.
CPC .......... *G06F 16/24561* (2019.01); *G06F 7/08* (2013.01); *G06F 16/2282* (2019.01); *G11C 5/143* (2013.01); *G11C 16/10* (2013.01)

(58) Field of Classification Search
CPC .. G06F 16/24561; G06F 16/2282; G06F 7/08; G11C 5/143; G11C 16/10
USPC .......................................................... 707/754
See application file for complete search history.

(56) References Cited

U.S. PATENT DOCUMENTS

| 9,128,965 B1 | 9/2015 | Yanacek |
| 9,292,564 B2 | 3/2016 | Kamp et al. |
| 9,514,187 B2 | 12/2016 | Ziauddin |
| 2012/0209873 A1 | 8/2012 | He |

(Continued)

OTHER PUBLICATIONS

Meiyyappan et al., U.S. Appl. No. 15/721,328, filed Sep. 29, 2017, Office Action.

(Continued)

*Primary Examiner* — Monica M Pyo
(74) *Attorney, Agent, or Firm* — Hickman Becker Bingham Ledesma LLP

(57) ABSTRACT

Region summaries of database data are stored in persistent memory of a storage cell. Because the region summaries are stored in persistent memory, when a storage cell is powered off and data in volatile memory is not retained, region summaries are nevertheless preserved in persistent memory. When the storage cell comes online, the region summaries already exist and may be used without the delay attendant to regenerating the region summaries stored in volatile memory.

18 Claims, 5 Drawing Sheets

(56) References Cited

U.S. PATENT DOCUMENTS

| | | | |
|---|---|---|---|
| 2013/0086330 A1* | 4/2013 | Baddepudi | G06F 12/0868 |
| | | | 711/143 |
| 2014/0279959 A1* | 9/2014 | Marwah | G06F 16/24556 |
| | | | 707/693 |
| 2015/0088813 A1* | 3/2015 | Lahiri | G06F 16/21 |
| | | | 707/803 |
| 2016/0371347 A1* | 12/2016 | Aronovich | G06F 16/1748 |
| 2018/0011893 A1 | 1/2018 | Kimura | |

OTHER PUBLICATIONS

Meiyyappan et al., U.S. Appl. No. 15/721,328, filed Sep. 29, 2017, Corrected Notice of Allowability, dated Jul. 9, 2021.
Meiyyappan et al., U.S. Appl. No. 15/721,328, filed Sep. 29, 2017, Office Action, dated Nov. 29, 2019.
Meiyyappan et al., U.S. Appl. No. 15/721,328, filed Sep. 29, 2017, Office Action, dated Nov. 13, 2020.
Meiyyappan et al., U.S. Appl. No. 15/721,328, filed Sep. 29, 2017, Notice of Allowance, dated Jun. 15, 2020.
Meiyyappan et al., U.S. Appl. No. 15/721,328, filed Sep. 29, 2017, Notice of Allowance, dated Mar. 16, 2021.
Meiyyappan et al., U.S. Appl. No. 15/721,328, filed Sep. 29, 2017, Corrected Notice of Allowability, dated Jun. 1, 2021.

* cited by examiner

Access-Derived Summary 200

| Region ID 212 | Col ID 214 | Min 216 | Max 218 |
|---|---|---|---|
| 1 | 1 |  | 5000 |
| 1 | 2 | 9/15/2016 | 10/01/2017 |
| 2 | 1 | 1400 | 7500 |
| 3 | 4 | Adams | Jefferson |
| ... | ... | ... | ... |

STORING DERIVED SUMMARIES ON PERSISTENT MEMORY OF A STORAGE DEVICE

RELATED APPLICATIONS

The present application is a continuation of U.S. patent application Ser. No. 15/721,328, entitled STORING DERIVED SUMMARIES ON PERSISTENT MEMORY OF A STORAGE DEVICE, filed on Sep. 29, 2017 by Krishnan Meiyyappan, et al., having, the contents of which are incorporated herein by reference.

The present application is related to U.S. patent application Ser. No. 15/720,949 entitled REMOTE ONE-SIDED PERSISTENT WRITES, filed on Sep. 29, 2017 by Jia Shi, et al., having, the entire contents of which are incorporated herein by reference.

The present application is related to U.S. patent application Ser. No. 15/720,959 entitled DATABASE WITH NVDIMM AS PERSISTENT STORAGE, filed on Sep. 29, 2017 by Nilesh Choudhury, et al., having, the entire contents of which are incorporated herein by reference.

The present application is related to U.S. patent application Ser. No. 15/720,972 entitled NON-VOLATILE CACHE ACCESS USING RDMA, filed on Sep. 29, 2017 by Zuoyu Tao, et al., having, the entire contents of which are incorporated herein by reference.

The present application is related to U.S. patent application Ser. No. 14/726,372, entitled OPTIMIZING A QUERY WITH EXTREMA FUNCTION USING IN-MEMORY DATA SUMMARIES ON THE STORAGE SERVER, filed on May 29, 2015 by Adrian Ng, et al., the entire contents of which are incorporated herein by reference.

TECHNICAL FIELD

The present disclosure relates to database systems. More specifically, the disclosure relates to processing database requests for data more efficiently.

BACKGROUND

A DBMS (Database Management System) is an important mechanism for storing and managing many types of data. A DBMS comprises at least one database server. The database server is hosted on at least one computing element (e.g. computer, server blade) and may store database data in block mode storage devices. The block mode storage devices may be one or more disk drives and flash drives connected via a high speed bus of the computing element to the one or more hardware processors ("processors") of the computing element and/or memory of the computing element. A block mode storage device may also be a network enabled storage device that is connected via a network to the computing element and that comprises other block storage devices such as disk drives and flash drives.

To respond to a query, a database server retrieves over a network the relevant data blocks from the storage server and processes the data blocks to generate the result set for the query. Such processing includes applying filtering criteria specified by a query predicate to rows in the data blocks. (The term criteria is used herein in both a singular sense or plural sense criteria, i.e. to mean a criterion or multiple criteria). Applying filtering criteria filters out rows from the retrieved data blocks. The filtered rows may not be returned as part of the result set for the query. Thus, network resources and memory resources on the database server are used to process filtered rows which are not needed for the result set.

To reduce use of network and memory resources for processing such filtered rows, storage devices have been configured with the capability to filter rows in data blocks before transmitting the rows and/or data blocks over a network to the database server. A database server transmits the filtered data block request to a storage device. The filtered data block request specifies filtering criteria and a range of one or more data blocks to which to apply the filtering criteria.

To service a filtered data block request for a range of data blocks, the storage device performs a filtered data block scan, which entails reading and evaluating each data block in the range. The storage device may return any data block that has at least one row that satisfies the filtering criteria. Alternatively, the storage device may marshal any rows that satisfy the filtering criteria into a new "return" data block which is returned to the database server.

To accelerate filtered data block scans, region summaries are used by a storage device to ignore regions of data blocks ("region") that could not contain a row that satisfies the filtering criteria. Ignoring regions in this way is referred to herein as region pruning. As the term is used herein, a region is a set of data blocks that are contiguously stored within a range of a memory address space exposed by a storage device, such as block addresses of a disk or flash memory device. The region summaries contain summary data about column values in columns stored in a region. Summary data is data that may be used to prune a region based on filtering criteria, such as a maximum value or a minimum value. For example, the in-memory summary for a particular region may specify that the maximum value in the column Cl is 1000. A storage device receives a filtered data block request covering the region, the filtering criteria specifying that Cl must be greater than 5000. Based on summary data on the column Cl in the region summary, the storage device determines that the particular region cannot contain any row satisfying the filtering criteria.

To enable quick access and updating of the region summaries, the region summaries are stored in volatile memory. Thus, region summaries disappear when a storage device goes down and are regenerated later when the storage device is powered on and comes online. Until region summaries are regenerated, the full benefit of using the summaries cannot be realized.

BRIEF DESCRIPTION OF THE DRAWINGS

The example embodiment(s) of the present invention are illustrated by way of example, and not in way by limitation, in the figures of the accompanying drawings and in which like reference numerals refer to similar elements and in which:

FIG. 2 illustrates an access-derived summary according to an embodiment of the present invention.

DESCRIPTION OF THE EXAMPLE EMBODIMENT(S)

Figure 1:
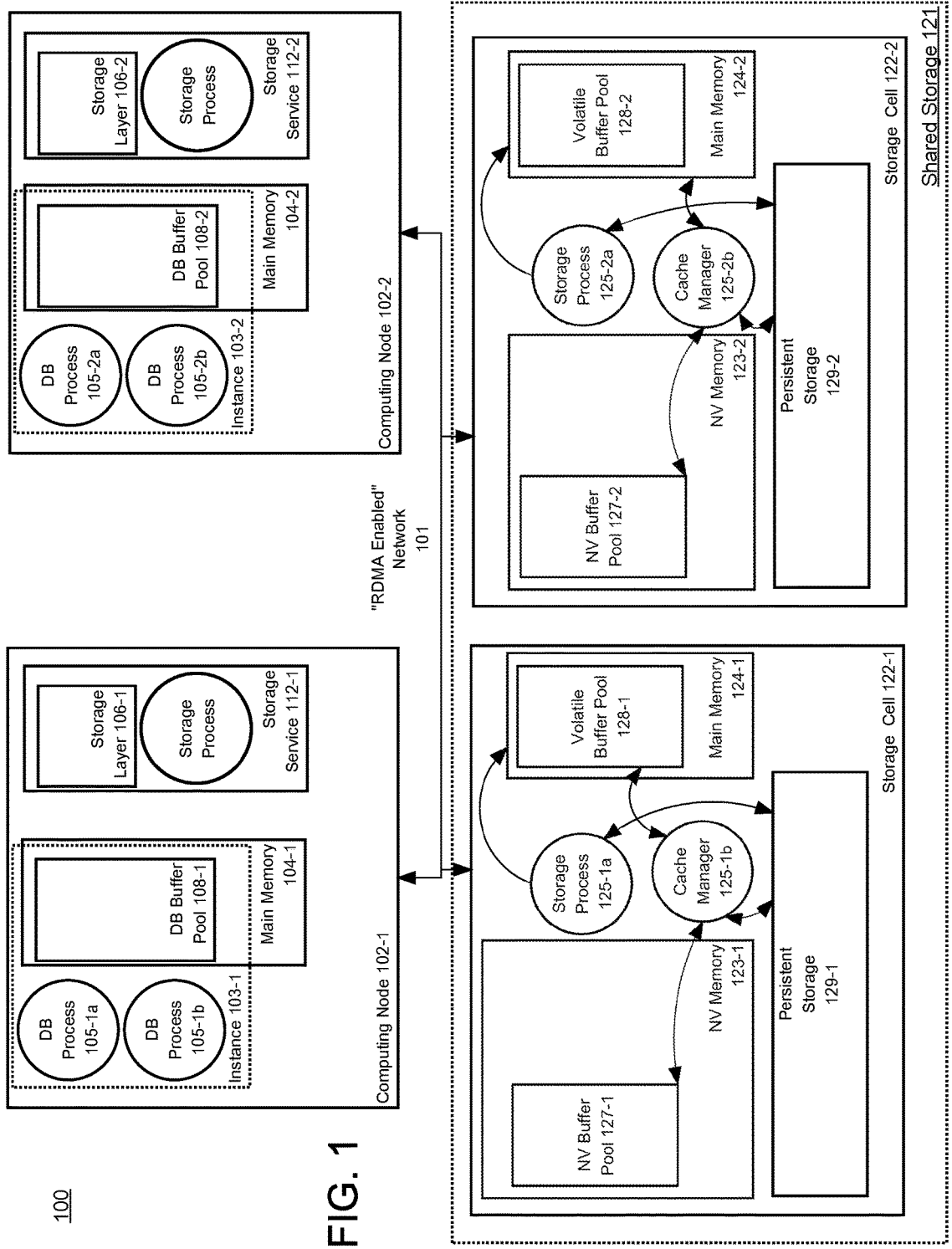
FIG. 1 illustrates a DBMS using a storage devices that use summaries of data stored on non-volatile memory of the storage devices to process requests for database data more efficiently.

In the following description, for the purposes of explanation, numerous specific details are set forth in order to provide a thorough understanding of the example embodiment(s) of the present invention. It will be apparent, however, that the example embodiment(s) may be practiced without these specific details.

General Overview

Described herein are techniques for storing region summaries of regions in persistent memory, regions that store, for example, data blocks that hold database data. The summaries are be used to determine a region can satisfy a filtering criterion, such as one based on a predicate in query. Because region summaries are stored in persistent memory, when a storage cell is powered off and data in volatile memory is not retained, region summaries are nevertheless preserved in persistent memory.

The summaries are referred to

The techniques described for storing region summaries on persistent memory use a form of region summaries referred to as access-derived region summaries or access-derived summaries. Access-derived summaries are generated and updated in response to performing filtered data block scans on data blocks by a storage device or in response to writes of data blocks to the storage device. For example, a storage device receives a filtered data block request covering multiple regions, the filtering criteria specifying that column C1 must be greater than 5000. While scanning the multiple regions, the storage device detects that one region does not have any rows that satisfy the criteria. For this one region, the storage device updates the access-derived summary for the region to indicate that the region does not contain a value that is greater than 5000 in column C1. Later, the storage device receives a request to write a data block to the region. The storage device compares the values in the data block for column C1 to the access-derived summary for that region and determines column C1 now has a new value larger than 5000. In response to the determination, the storage device modifies the access-derived summary to reflect the maximum value.

The access-derived summaries can be persisted by storing the summaries on persistent storage devices, such as flash or disk. However, flash and disk are block mode storage devices with relatively very high read and write latency. Use of such devices would add the overhead of high latency read and/or write operations when performing a filtered data block scan or a data block write operation of a data block.

In addition, the smallest amount of data that may be modified in a block mode storage device is a block. Updating an access-derived summary stored in a block mode storage device may require reading a block from the block mode storage device into a memory location within RAM, updating the block within the RAM, and writing the entire block back to the block mode storage device. In addition, a data block may have to be unserialized into an in-memory form and serialized before being written back to the block mode storage device. Updating an access-derived summary may also only entail changing a number of bytes that is much smaller than a block. However, even though a small number of bytes need to be changed in an access-derived summary that is stored in the block, all the operations mentioned above need to be performed to update the summary in the block.

To persist access-derived summaries in a way that allows the access-derived summaries to be generated and maintained more efficiently than in a block mode storage device, the access-derived summaries are stored in non-volatile random access memories (NVRAMs) of storage devices. NVRAM may have higher latency than volatile RAM but has much less latency than other forms of persistent storage, such as disk or flash. Like non-volatile RAM, NVRAM is byte addressable; an addressable byte or word may be loaded from NVRAM via a bus to a register of a hardware processor. Thus, access-derived summaries are modified in place in RAM, that is, without moving a block from a block device to RAM to be modified.

Illustrative DBMS

Persisted access-derived summaries are illustrated in the context of a multi-node DBMS. A DBMS comprises at least one database server. The database server is hosted on at least one computing element and may store database data in block mode storage devices. The block mode storage devices may be disk drives and flash drives connected via a high speed bus of the computing element to the one or more hardware processors of the computing element and/or memory of the computing element. A block mode storage device may also be a network enabled storage device that is connected via a network to the computing element and that compromises other block mode storage devices such as disk drives and flash drives.

More powerful DBMSs are hosted on a parallel processer hardware platform. Such DBMSs are referred to herein as multi-node DBMSs. A multi-node DBMS comprises multiple computing elements referred to herein as computing nodes. Each computing node comprises a hardware processor or multiple hardware processors that each share access to the same main memory.

FIG. 1 is a block diagram that illustrates a multi-node DBMS. Referring to FIG. 1, multi-node DBMS 100 comprises database server instances, each hosted on a respective computing node, and each providing access to the same database stored on shared storage 121. The database server instances of DBMS 100 comprise database server instances 103-1 and 103-2, which are hosted on computing nodes 102-1 and 102-2 respectively. The shared storage 121 comprises storage cells 122-1 and 122-2. Each of database server instances 103-1 and 103-2 is connected by a high speed network 101 to each of storage cells 122-1 and 122-2.

Each of storage cells 122-1 and 122-2 is a computing element that includes persistent storage (e.g., disk, flash memory) for storing "database files" of the one or more databases of DBMS 100. Storage cell 122-1 includes persistent storage 129-1 and main memory 124-1 and storage cell 122-2 includes persistent storage 129-2 and main memory 124-2. Main memory 124-1 and main memory 124-2 are volatile RAMs. Persistent storage 129-1 and persistent storage 129-2 may comprise persistent storage devices such as disk devices or flash memory devices.

One or more storage processes running on each of storage cells 122-1 and 122-2, such as storage process 125-1a and storage process 125-2a, receive requests from any of database server instances 103-1 and 103-2 to read or write data blocks from or to database files stored in persistent storage.

Volatile buffer pool 128-1 and volatile buffer pool 128-2 are buffer pools allocated from main memory 124-1 and main memory 124-2, respectively. Volatile buffer pool 128-1 and volatile buffer pool 128-2 each comprises buffers, and each is used for temporarily staging and/or caching of data blocks stored in persistent storage 129-1 and persistent storage 129-2, respectively.

Storage cells 122-1 and 122-2 also include NVRAM 123-1 and NVRAM 123-2, respectively. NV buffer pool 127-1 and NV buffer pool 127-2 are buffer pools allocated from NVRAM 123-1 and NVRAM 123-2, respectively. NV buffer pool 127-1 and NV buffer pool 127-2 each comprises buffers that are being used for temporarily staging and/or caching data blocks from persistent storage 129-1 and 129-2, respectively. NV buffer pool 127-1 and NV buffer pool 127-2 may each be referred to herein as a NV cache.

Database Server Instances

Each of the database server instances of DBMS 100 comprise database processes that run on the computing node that hosts the database server instance. A database process may be, without limitation, a process running within a database session that executes database commands issued within the database session or a query execution process belonging to a pool of processes that is assigned to execute queries issued through database sessions.

Referring to FIG. 1, each of database server instances 103-1 and 103-2 comprise multiple database processes and database buffers that cache data blocks read from shared storage 121. Database server instances 103-1 and 103-2 are hosted on computing nodes 102-1 and 102-2, respectively. Database server instance 103-1 comprises DB processes 105-1*a* and 105-1*b*, which run on computing node 102-1, and database buffer pool 108-1, which is allocated from main memory 104-1. Database server instance 103-2 comprises database processes 105-2*a* and 105-2*b*, which run on computing node 102-2, and database buffer pool 108-2, which is allocated from main memory 104-2.

Access-Derived Summaries

FIG. 2 is a diagram depicting access-derived summaries according to an embodiment. Referring to FIG. 2, access-derived summary 200 includes entries with each entry having an attribute region ID 212, col ID 214, min 216 and max 218. Although access-derived summary 200 is depicted as a tabular structure, any in-RAM data structure that provides for entries that are accessible using one or more attributes as an access key may be used.

Region ID 212 contains region IDs, each of which identifies a region. A region ID may be generated based on a location of a region and is used to look up summary data for a range of data blocks specified by a filtered data block request. A range in a filtered data block request may cover multiple regions. Col ID 214 identifies a column stored in the region about which an entry has statistics. Min 216 and max 218 contain extrema values about the column in the region. According to an embodiment, max 218 specifies a "max" value not exceeded by a column value in a column in a region. The value may not be an actual maximum in the column. According to an embodiment, Min 216 specifies a "min" value not exceeded by a column value in a column in a region; there is no column in the region that is less. The value may not be the actual minimum in the column.

Each entry in access-derived summary 200 includes a min and max value for the region and column identified by the values in region ID 212 and rol ID 214. For example, the first entry for access-derived summary 200 specifies a max value 5000 for the column in the region that are identified by column ID 1 and region ID 1, respectively. The fourth entry specifies a min value of "Adams" and max value of "Jefferson" for the column in the region that are identified by column ID 3 and region ID 4, respectively.

As mentioned before, when a storage device comes online after having lost data retained in volatile memory due to, for example, loss of power to the volatile memory, the access-derived summary is preserved in NVRAM. The entries that were in the access-derived summary that were used for region pruning before the power loss may be used for region pruning after when storage device comes back online.

Generating Access-Derived Summaries

According to an embodiment, access-derived summaries are updated in response to filtered data block requests, and are updated based on the results of the filtered data block requests.

Database processes running on DBMS 100 may issue a filtered data block request to a storage process running on a storage cell of shared storage 121. The filtered data block request specifies a range of data blocks and filtering criteria. In response to receiving a filtered data block request, a storage process performs filtered data block scans. Filtered data block scans comprise reading data blocks specified in the request, and applying the filtering criteria to return data blocks that satisfy the criteria.

Filtered data blocks returned as satisfying the request may be data blocks containing at least one row satisfying the filtering criteria or may be data blocks that contain only rows that satisfy the filtering criteria, the rows having been extracted from the specified data blocks by the storage process. The term data block is used herein to refer to either copies of data blocks stored in persistent storage or data blocks that contain rows extracted from the data blocks.

Examples of filtered data block requests and handling thereof are described in U.S. patent application Ser. No. 14/480,009, entitled Query And Exadata Support For Hybrid Columnar Compressed Data, filed on Sep. 8, 2014, by Vineet Marwah, et al., the entire contents of which are incorporated herein by reference.

According to an embodiment, access-derived summaries are updated in response to filtered data block requests when "summary update" criteria is satisfied. For example, under an approach for updating summaries referred to as the fully-selectively approach, summary update includes at least two criteria. One is that the filtering criteria be fully selective for a region. That is, no row in any data block in a region satisfies the filtering criteria. Another is that the Boolean result of the filtering criteria is a result from which summary data may be derived, such as filtering criteria based on conditions like less than and greater than. For example, if the filtering criteria is that a column value for a column be greater than 5000 and the result of the filtering criteria for a region is that no rows in the region include a column value for the column that is greater than 5000, then the summary update criteria is satisfied and the accessed-derived summary for that region may be updated accordingly.

An advantage of access-derived summaries stems from the fact that summaries are generated for actual accesses to regions. Specifically, filtered data block requests for ranges of data blocks are probative of what ranges will be the subject of filtered data block requests in the imminent future. Memory usage is thus restricted to an conserved for storing access-derived summaries for regions that are more likely to be accessed imminently. Similarly, because updating of the access-derived summaries under the fully selective approach is limited to predicates that have eliminated entire regions, creation and storing of summary data is restricted to columns that are more likely to be used in filtering criteria of future data block requests and for filtering criteria that more likely to eliminate regions.

As mentioned previously, the access-derived summaries are updated in NVRAM. Thus, the advantages of persisting access-derived summaries are achieved without the overhead attendant to updating access-derived summaries that are stored in block mode persistent storage mechanisms, such as flash.

Access-derived summaries may be updated in response to filtered data block requests under different criteria and conditions than those described above. For example, while a range of data blocks is scanned against filtering criteria for a column, the actual min and max values encountered for the column may be recorded in access-derived summaries even though one or more data block satisfied filtering criteria. This alternative has the advantage recording summary data for column values in a manner that piggybacks onto work being performed any, i.e., filtering on the filtering criteria, by adding negligible work to that operation.

Maintaining Coherency

Access-derived summaries are coherent with the respective regions when the access-derived summaries are maintained and used in a way that ensures the access-derived summaries validly reflect the respective regions. Obviously, since the access-derived summaries are used to prune regions, maintaining coherency is important.

Writes of a data block to a region may require updating the corresponding access-derived summary for that region. Using an access-derived summary for pruning the respective region while an ongoing write operation is occurring in the region should be prevented to ensure coherency. According to an embodiment, ensuring coherency entails preventing the use of an access-derived summary for a region once a write of that data block has commenced and until the write is complete, and until the determination of whether to update the access-derived summary and any determined update is also complete.

According to an embodiment, to ensure coherency, at least in part, the use of access-derived summaries by region pruning for regions is synchronized with data block write operations to those regions. When a data block write operation is commenced for a data block within the region, "in-flight metadata" stored in NRVAM is marked to indicate the corresponding region is undergoing a write. Specifically, the in-flight metadata contains an entry for each region and an in-flight counter. When a data block write operation is commenced for a data block within the region, the in-flight counter for the region is incremented. After incrementing the in-flight counter, the data block is written, a determination is made of whether the respective access-derived summary requires updating, and then the access-derived summary is updated as accordingly. Next, the in-flight counter is decremented.

Between the incrementing and decrementing of the counter for a data block write operation, the data block write operation is referred to herein as being in-flight. At a given instant, there may be multiple in-flight data block write operations for a region, and the in-flight counter for the region reflects the number of in-flight data block write operations.

When an in-flight counter reflects there is at least one in-flight data block write operation, the region is referred to as being marked as undergoing a data block write. When the in-flight counter reflects there is no in-flight data block write operation, the region is referred to as being marked as not undergoing a data block write operation.

Figure 3:
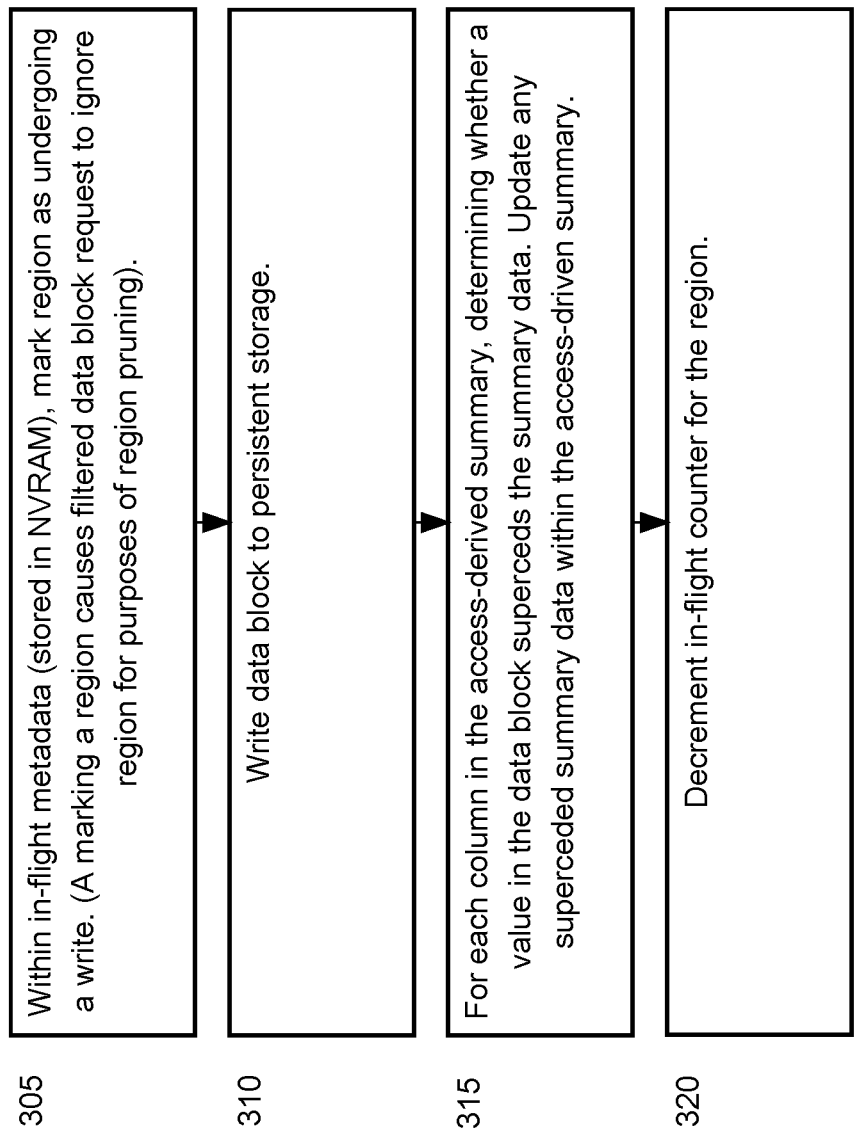
FIG. 3 illustrates a coherent data block write operation according to an embodiment of the present.

Performing a data block write operation and the operations needed to carry out the data block operation in a way that ensures coherency is referred to herein as a coherent data block write operation. FIG. 3 depicts a procedure for a coherent data block write operation according to an embodiment of the present invention. For purposes of illustration, a data block is being written to a region having region ID 1.

Referring to FIG. 3, at 305, the in-flight counter is incremented. At 310, the data block is written to persistent storage.

At 315, it is determined whether any of the summary data for the region is superseded by column values in the data block. For each column in the access-derived entries for the region, summary data is compared to values in the data block for that column and the summary data is updated if the values require. For example, for a column having column identifier 2, the data block contains a column value 11/19/2016, which exceeds the max value 10/01/2017 in max 218 for access-derived summary entry for the column identifier 2. Accordingly, the column value 11/19/2016 supersedes the max value 10/01/2017 in max 218 of the entry, and max 218 for the entry is updated to 11/19/2016.

At 320, the in-flight counter for the region is decremented.

Pruning with Coherance

A filtered data block request for which region pruning may be performed may specify a data block address range for multiple regions. For each of these regions, the in-flight metadata is consulted to determine whether the access-derived summary for the region is coherent with the region and may therefore be relied upon for region pruning. If it is determined that the in-flight counter indicates one or more data block write operations are in-flight for the region, the access-derived summary is ignored, and the data blocks in the region are scanned and filtered.

It is also possible a region for which access-derived summary data is generated may be used to store a different table than the table for which the summary data was generated. According to an embodiment, an accessed-derived summary associates a table with a region. The table may be a separate column or attribute like a region ID or column ID, or may be embedded within a region ID or column ID, such as a table ID included as a prefix to a region ID or column ID. A request issued to a storage for data block write operation to a region would indicate the table for which a write is being performed by, for example, specifying the table id. If the table specified by the request and table specified for the region by the access-derived summary do not match, then the entries for the region are deleted or otherwise invalidated.

NVRAM-Based In-Flight Metadata Advantages & Caveats

In-flight metadata is stored in NVRAM so that in-flight metadata persists along with the access-derived summary. When a storage device comes online after having lost data retained in volatile memory due to, for example, loss of power to the volatile memory, not only is the access-derived summary preserved in NVRAM for region pruning but so is in-flight metadata. Importantly, the in-flight metadata, which is needed to determine the coherency of the access-derived summary for specific regions, is available. For regions that have in-flight counters in the access-derived summary that mark the regions as having in-flight data block write operations, the entries for the regions are deleted or otherwise marked as invalidate so that the entries are no longer used for region pruning.

In addition, storing the in-flight metadata in NVRAM avoids overhead of updating the access-derived summary that would be attendant to storing the access-derived summary in block mode storage mechanisms, such as flash. Such overhead is avoided twice for a data block operation, once to increment an in-flight counter in persistent and once to decrement an in-flight counter memory.

Memory Overview

Because embodiments of the invention involve a novel use of a non-volatile RAM, a description of memory is pertinent and useful. As used herein, "non-volatile" refers to a characteristic of memory that retains data in the absence of any form of electrical power, including external or battery backup. Examples of non-volatile memory include e-prom memory, flash memory, and disk memory. Non-volatile memory does not include volatile memory for which power is retained by a battery backup in the absence of another external power source. For example, volatile memory coupled to a board with an embedded battery-backup is not non-volatile memory, because, without the power provided by a battery, the volatile memory does not retain data.

Byte-addressable memory is distinguishable from block-addressable memory. A byte is eight bits and is the minimum amount of data that may be addressed, retrieved from memory, or written to in byte-addressable memory. Thus, to manipulate a bit in a byte, a byte containing the bit must be fetched to a register of the processor executing a machine instruction that references the byte (or word containing the byte) and manipulated according to the machine instruction or another machine instruction.

In contrast, the minimum size for a unit of block-addressable memory is a data block. A data block comprises multiple bytes and multiple words and cannot be entirely stored within a register of processor. For block-addressable memory, a data block is the minimum amount of data that may be addressed, retrieved from memory, or written to memory. Examples of block-addressable memory include flash memory and disk memory. To manipulate a bit or a byte in a block, a block containing those bits is loaded into a byte-addressable memory by an instruction referencing the block issued to a block-based interface.

RAM is distinguishable from read-only memory (ROM) in that data in RAM can be overwritten. As used herein, overwriting data refers to replacing the data with new data without first having to erase the data in the memory. Thus, as used herein, RAM refers to byte-addressable memory that can be overwritten.

DBMS Overview

A DBMS manages one or more databases. A DBMS may comprise one or more database servers referred to herein as database server instances. A database comprises database data and a database dictionary that are stored on a persistent memory mechanism. Database data may be stored in one or more data containers. Each container contains records. The data within each record is organized into one or more fields. In relational DBMS's, the data containers are referred to as tables, the records are referred to as rows, and the fields are referred to as columns. In object-oriented databases, the data containers are referred to as object classes, the records are referred to as objects, and the fields are referred to as attributes. Other database architectures may use other terminology.

Users interact with a database server instance of a DBMS by submitting to the database server commands that cause the database server instance to perform operations on data stored in a database, as well as other kinds of operations. A database command may be in the form of a database statement that conforms to a database language. A database language for expressing the database commands is the Structured Query Language (SQL). There are many different versions of SQL, some versions are standard and some proprietary, and there are a variety of extensions. Data definition language commands are issued to a database server to create or configure database objects, such as tables, views, or complex data types. DDL commands are used to configure a database server for a particular hardware environment, to configure computer resource usage of the database server, as well as other operating aspects of the database server.

A server, such as a database server, is a combination of software and an allocation of computational resources, such as memory, a node, and processes on the node for executing the integrated software components on a processor, the combination of the software and computational resources being dedicated to performing a particular function on behalf of one or more clients.

Resources from multiple nodes in a multi-node database system can be allocated to running a particular database server's software. Each combination of the software and allocation of resources from a node is a server that is referred to as a "server instance" or "instance." A database server may comprise multiple database server instances, some or all of which are running on separate computer elements.

Database processes that comprise a database server run under the control of the database server (i.e., can be created or terminated by the database server) and perform various database server functions. Such processes are referred to herein as database processes. Database processors include listeners, garbage collectors, log writers, processes for database sessions for executing database commands issued by database clients (including processes executing within shared sessions), and recovery processes.

A database process may comprise state objects that indicate state information for the process and allows the DBMS to manage and track the process. A typical database thread may also comprise a state object. A state object is a resource that is visible to the DBMS and indicates to the DBMS the state of the process. For example, a state object may indicate whether a process is free, unavailable, or failed. Thus, the DBMS can use the state object to determine how many processes are running in the database system, which ones are available, and clean up failed processes.

In an embodiment, the DBMS comprises a resource manager, which handles database processes for the database system. The resource manager may be a background daemon, a database component, software module, or some combination thereof. The resource manager may monitor database instance(s) and track processor and I/O resources across database processes. In an embodiment, the resource manager is a process scheduler that interrupts, de-schedules, schedules, or otherwise controls when database processes may run.

In an embodiment, state objects are used by the resource manager to track the current state of database processes. As used herein, a state can include information regarding a database process, login credentials for a database session, current database transactions, and resources held by a process or thread. Examples of state objects include process, session, and call state objects. Process state objects keep a process' information, attributes (such as dead, system process, fatal system process, cleanup process, shared server, and etc.), and other process structures such as a process interrupt queue.

Data Blocks

A data block is used by a DBMS to store one or row more database rows, or portions of rows, including one or more columns of a row. When rows are read from persistent storage, a data block containing the row is copied into a data block buffer in RAM and/or main memory of a database server. A data block that is used to store database data maybe referred to herein as a database block. A database block usually contains multiple rows, and database block metadata describing the contents of the database block. Metadata includes control and formatting information, such as offsets to sequences of bytes representing rows or other data structures, and a list of transactions affecting a row.

A database block is referred to as being atomic because, at least in part, a database block is the smallest unit of database data a database server may request from a persistent storage device. For example, when a database server seeks a row that is stored in a data block, the data block may only read the row from a persistent storage device by reading in the entire data block.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 4:
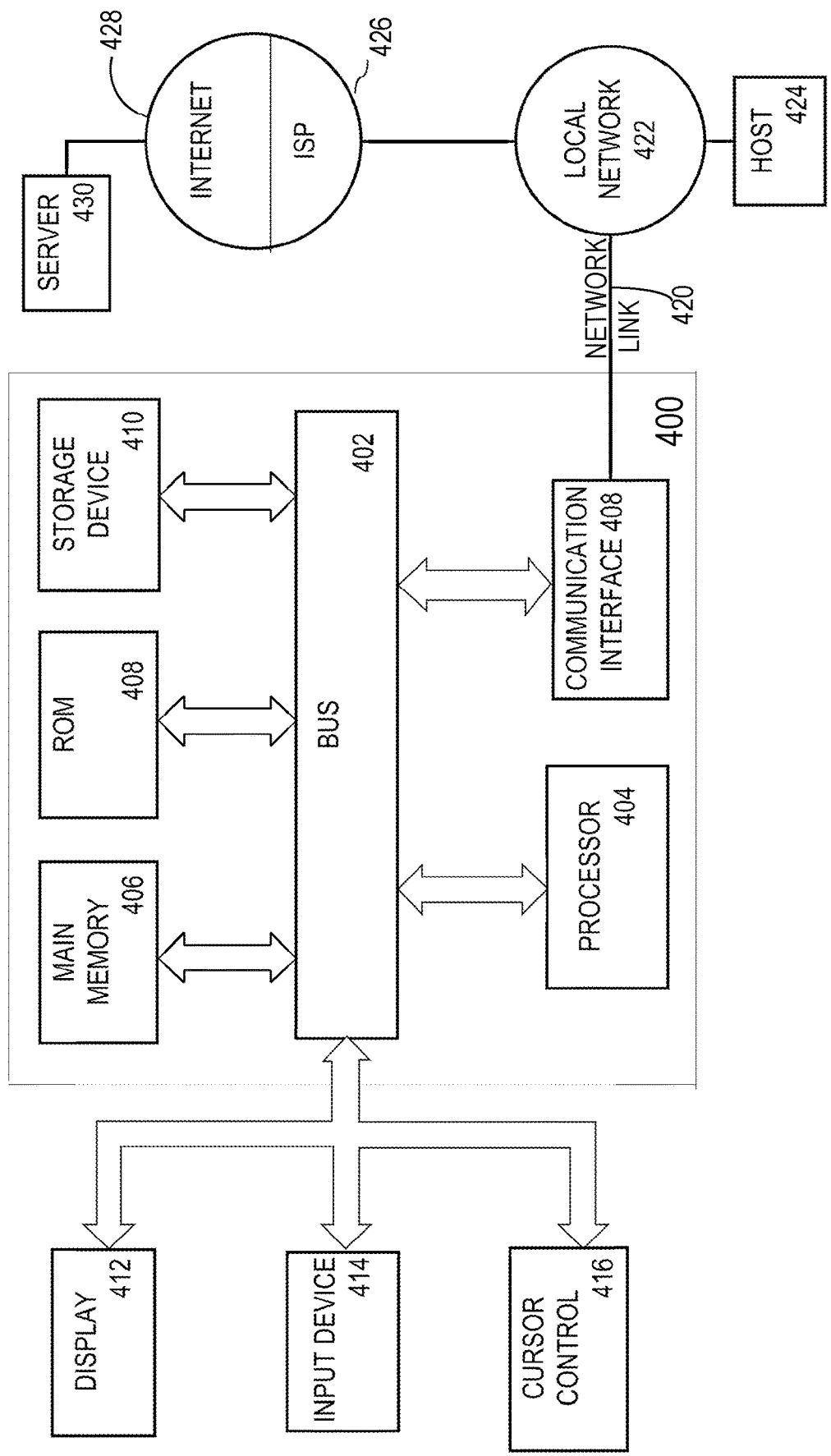
FIG. 4 is a diagram of a computer system on which embodiments may be implemented.

For example, FIG. 4 is a block diagram that illustrates a computer system 400 upon which an embodiment of the invention may be implemented. Computer system 400 includes a bus 402 or other communication mechanism for communicating information, and a hardware processor 404 coupled with bus 402 for processing information. Hardware processor 404 may be, for example, a general purpose microprocessor.

Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk, optical disk, or solid-state drive is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 410. Volatile media includes dynamic memory, such as main memory 406. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infra-red data communications.

Various forms of media may be involved in carrying one or more sequences of one or more instructions to processor 404 for execution. For example, the instructions may initially be carried on a magnetic disk or solid-state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

Software Overview

Figure 5:
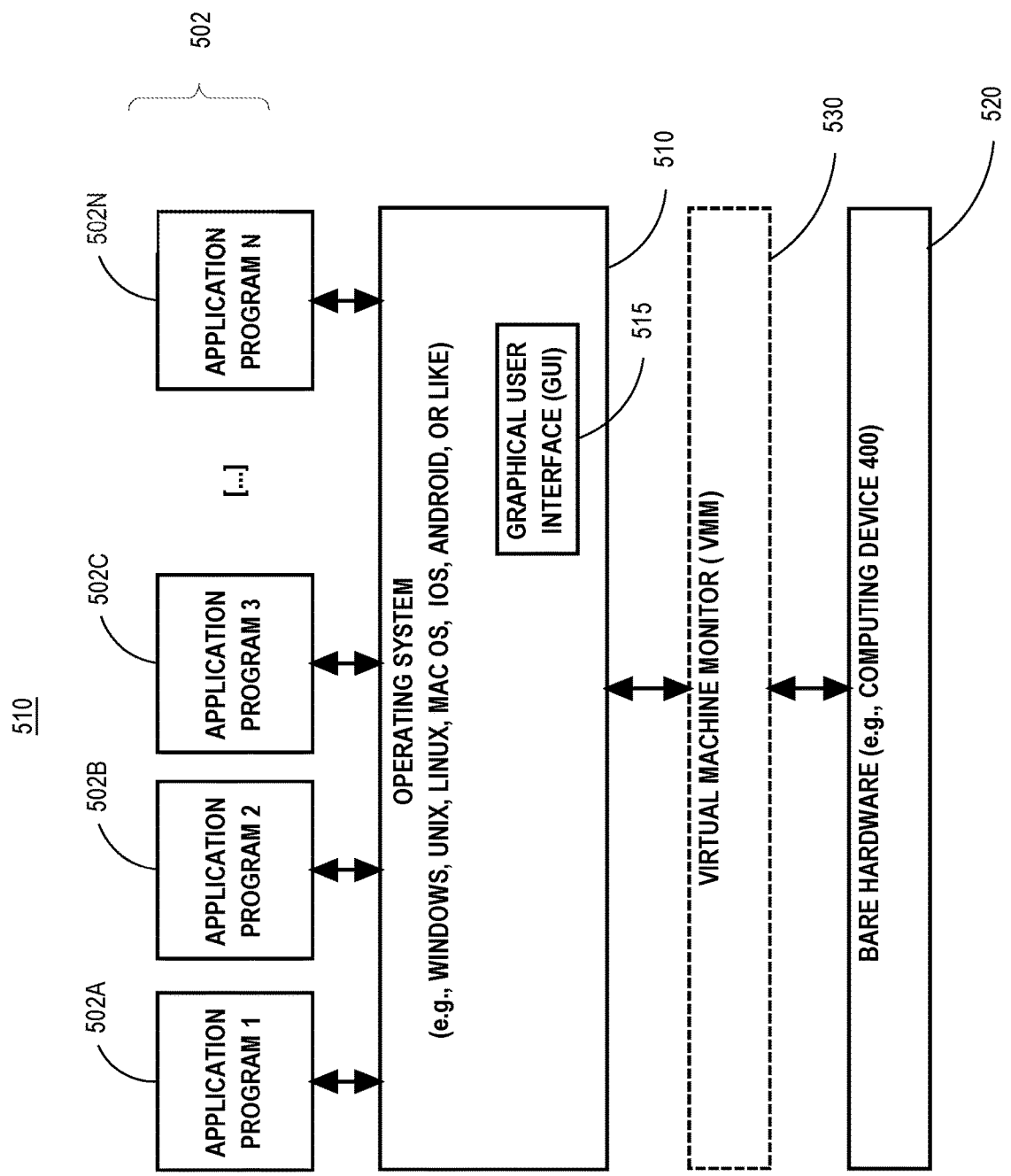
FIG. 5 is a diagram of a software system that may be employed for controlling the operation of a computer system according to an embodiment of the present invention.

FIG. 5 is a block diagram of a basic software system 500 that may be employed for controlling the operation of computer system 400. Software system 500 and its components, including their connections, relationships, and functions, is meant to be exemplary only, and not meant to limit implementations of the example embodiment(s). Other software systems suitable for implementing the example embodiment(s) may have different components, including components with different connections, relationships, and functions.

Software system 500 is provided for directing the operation of computer system 400. Software system 500, which may be stored in system memory (RAM) 406 and on fixed storage (e.g., hard disk or flash memory) 410, includes a kernel or operating system (OS) 510.

The OS 510 manages low-level aspects of computer operation, including managing execution of processes, memory allocation, file input and output (I/O), and device I/O. One or more application programs, represented as 502A, 502B, 502C . . . 502N, may be "loaded" (e.g., transferred from fixed storage 410 into memory 406) for execution by the system 500. The applications or other software intended for use on computer system 400 may also be stored as a set of downloadable computer-executable instructions, for example, for downloading and installation from an Internet location (e.g., a Web server, an app store, or other online service).

Software system 500 includes a graphical user interface (GUI) 515, for receiving user commands and data in a graphical (e.g., "point-and-click" or "touch gesture") fashion. These inputs, in turn, may be acted upon by the system 500 in accordance with instructions from operating system 510 and/or application(s) 502. The GUI 515 also serves to display the results of operation from the OS 510 and application(s) 502, whereupon the user may supply additional inputs or terminate the session (e.g., log off).

OS 510 can execute directly on the bare hardware 520 (e.g., processor(s) 404) of computer system 400. Alternatively, a hypervisor or virtual machine monitor (VMM) 530 may be interposed between the bare hardware 520 and the OS 510. In this configuration, VMM 530 acts as a software "cushion" or virtualization layer between the OS 510 and the bare hardware 520 of the computer system 400.

VMM 530 instantiates and runs one or more virtual machine instances ("guest machines"). Each guest machine comprises a "guest" operating system, such as OS 510, and one or more applications, such as application(s) 502, designed to execute on the guest operating system. The VMM 530 presents the guest operating systems with a virtual operating platform and manages the execution of the guest operating systems.

In some instances, the VMM 530 may allow a guest operating system to run as if it is running on the bare hardware 520 of computer system 400 directly. In these instances, the same version of the guest operating system configured to execute on the bare hardware 520 directly may also execute on VMM 530 without modification or reconfiguration. In other words, VMM 530 may provide full hardware and CPU virtualization to a guest operating system in some instances.

In other instances, a guest operating system may be specially designed or configured to execute on VMM 530 for efficiency. In these instances, the guest operating system is "aware" that it executes on a virtual machine monitor. In other words, VMM 530 may provide para-virtualization to a guest operating system in some instances.

A computer system process comprises an allotment of hardware processor time, and an allotment of memory (physical and/or virtual), the allotment of memory being for storing instructions executed by the hardware processor, for storing data generated by the hardware processor executing the instructions, and/or for storing the hardware processor state (e.g. content of registers) between allotments of the hardware processor time when the computer system process is not running. Computer system processes run under the control of an operating system, and may run under the control of other programs being executed on the computer system.

Cloud Computing

The term "cloud computing" is generally used herein to describe a computing model which enables on-demand access to a shared pool of computing resources, such as computer networks, servers, software applications, and services, and which allows for rapid provisioning and release of resources with minimal management effort or service provider interaction.

A cloud computing environment (sometimes referred to as a cloud environment, or a cloud) can be implemented in a variety of different ways to best suit different requirements. For example, in a public cloud environment, the underlying computing infrastructure is owned by an organization that makes its cloud services available to other organizations or to the general public. In contrast, a private cloud environment is generally intended solely for use by, or within, a single organization. A community cloud is intended to be shared by several organizations within a community; while a hybrid cloud comprises two or more types of cloud (e.g., private, community, or public) that are bound together by data and application portability.

Generally, a cloud computing model enables some of those responsibilities which previously may have been provided by an organization's own information technology department, to instead be delivered as service layers within a cloud environment, for use by consumers (either within or external to the organization, according to the cloud's public/private nature). Depending on the particular implementation, the precise definition of components or features provided by or within each cloud service layer can vary, but common examples include: Software as a Service (SaaS), in which consumers use software applications that are running upon a cloud infrastructure, while a SaaS provider manages or controls the underlying cloud infrastructure and applications. Platform as a Service (PaaS), in which consumers can use software programming languages and development tools supported by a PaaS provider to develop, deploy, and otherwise control their own applications, while the PaaS provider manages or controls other aspects of the cloud environment (i.e., everything below the run-time execution environment). Infrastructure as a Service (IaaS), in which consumers can deploy and run arbitrary software applications, and/or provision processing, storage, networks, and other fundamental computing resources, while an IaaS provider manages or controls the underlying physical cloud infrastructure (i.e., everything below the operating system layer). Database as a Service (DBaaS) in which consumers use a database server or Database Management System that is running upon a cloud infrastructure, while a DbaaS provider manages or controls the underlying cloud infrastructure, applications, and servers, including one or more database servers.

Extensions and Alternatives

Although some of the figures described in the foregoing specification include flow diagrams with steps that are shown in an order, the steps may be performed in any order, and are not limited to the order shown in those flowcharts. Additionally, some steps may be optional, may be performed multiple times, and/or may be performed by different components. All steps, operations and functions of a flow diagram that are described herein are intended to indicate operations that are performed using programming in a special-purpose computer or general-purpose computer, in various embodiments. In other words, each flow diagram in this disclosure, in combination with the related text herein, is a guide, plan or specification of all or part of an algorithm for programming a computer to execute the functions that are described. The level of skill in the field associated with this disclosure is known to be high, and therefore the flow diagrams and related text in this disclosure have been prepared to convey information at a level of sufficiency and detail that is normally expected in the field when skilled persons communicate among themselves with respect to programs, algorithms and their implementation.

In the foregoing specification, the example embodiment(s) of the present invention have been described with reference to numerous specific details. However, the details may vary from implementation to implementation according to the requirements of the particular implement at hand. The example embodiment(s) are, accordingly, to be regarded in an illustrative rather than a restrictive sense.

The invention claimed is:

1. A method, comprising:
a storage device receiving a filtered data block request from a database server specifying a range of data blocks to scan according to one or more filtering criteria specified by said filtered data block request, said range of data blocks corresponding to a plurality of regions described by a summary that is stored in non-volatile RAM (NVRAM) of said storage device;
for a subset of regions of said plurality of regions:
based on said summary, determining that said subset of regions does not contain any data blocks that have rows that satisfy said one or more filtering criteria;
in response to determining that said subset of regions contains no data blocks that have rows that satisfy said one or more filtering criteria, pruning said subset of regions from scanning and filtering; and
for a first region of said plurality of regions not in said subset of regions, in response to determining a result for said one or more filtering criteria for said filtered data block scan on said first region of said plurality of regions:
determining that the result for said one or more filtering criteria for said filtered data block scan on said first region satisfies one or more criteria for updating the summary; and
in response to determining that the result for said one or more filtering criteria for said filtered data block scan on said first region satisfies one or more criteria for updating the summary, updating in place within said NVRAM at least one entry in said summary based on said result for said one or more filtering criteria.

2. The method of claim 1, wherein said NVRAM is byte addressable.

3. The method of claim 1, further including after volatile memory in said storage device losing data due to loss of power to said volatile memory:
receiving another filtered data block request; and
to perform region pruning for said another filtered data block request, using entries in said summary that were stored in said NVRAM before said loss of power.

4. The method of claim 1, wherein using entries includes accessing said at least one entry in place after said updating in place within said NVRAM said at least one entry.

5. The method of claim 1, wherein said one or more criteria for updating the summary includes that no rows in said first region of data blocks satisfy said one or more filtering criteria.

6. The method of claim 1, wherein said summary indicates at least one of a max value and min value in a column stored in at least some of said plurality of regions.

7. One or more non-transitory computer-readable media storing one or more sequences of instructions that, when executed by one or more processors, cause:
a storage device receiving a filtered data block request from a database server specifying a range of data blocks to scan according to one or more filtering criteria specified by said filtered data block request, said range of data blocks corresponding to a plurality of regions described by a summary that is stored in non-volatile RAM (NVRAM) of said storage device;

for a subset of regions of said plurality of regions:
   based on said summary, determining that said subset of regions does not contain any data blocks that have rows that satisfy said one or more filtering criteria;
   in response to determining that said subset of regions contains no data blocks that have rows that satisfy said one or more filtering criteria, pruning said subset of regions from scanning and filtering; and
for a first region of said plurality of regions not in said subset of regions, in response to determining a result for said one or more filtering criteria for said filtered data block scan on said first region of said plurality of regions:
   determining that the result for said one or more filtering criteria for said filtered data block scan on said first region satisfies one or more criteria for updating the summary; and
   in response to determining that the result for said one or more filtering criteria for said filtered data block scan on said first region satisfies one or more criteria for updating the summary, updating in place within said NVRAM at least one entry in said summary based on said result for said one or more filtering criteria.

8. The one or more non-transitory computer-readable media of claim 7, wherein said NVRAM is byte addressable.

9. The one or more non-transitory computer-readable media of claim 7, wherein the sequences of instructions include instructions that, when executed by one or more processors, cause, after volatile memory in said storage device losing data due to loss of power to said volatile memory:
   receiving another filtered data block request; and
   to perform region pruning for said another filtered data block request, using entries in said summary that were stored in said NVRAM before said loss of power.

10. The one or more non-transitory computer-readable media of claim 7, wherein using entries includes accessing said at least one entry in place after said updating in place within said NVRAM said at least one entry.

11. The one or more non-transitory computer-readable media of claim 7, wherein said one or more criteria for updating the summary includes that no rows in said first region of said plurality of regions satisfy said one or more filtering criteria.

12. The one or more non-transitory computer-readable media of claim 7, wherein said summary indicates at least one of a max value and min value in a column stored in at least some of said plurality of regions.

13. A storage device, said storage device being configured to:
   receive a filtered data block request from a database server specifying a range of data blocks to scan according to one or more filtering criteria specified by said filtered data block request, said range of data blocks corresponding to a plurality of regions described by a summary that is stored in non-volatile RAM (NVRAM) of said storage device;
   for a subset of regions of said plurality of regions:
      based on said summary, determine that said subset of regions does not contain any data blocks that have rows that satisfy said one or more filtering criteria;
      in response to determining that said subset of regions contains no data blocks that have rows that satisfy said one or more filtering criteria, prune said subset of regions from scanning and filtering; and
   for a first region of said plurality of regions not in said subset of regions, in response to determining a result for said one or more filtering criteria for said filtered data block scan on said first region of said plurality of regions:
      determine that the result for said one or more filtering criteria for said filtered data block scan on said first region satisfies one or more criteria for updating the summary; and
      in response to determining that the result for said one or more filtering criteria for said filtered data block scan on said first region satisfies one or more criteria for updating the summary, update in place within said NVRAM at least one entry in said summary based on said result for said one or more filtering criteria.

14. The storage device of claim 13, wherein said NVRAM is byte addressable.

15. The storage device of claim 13, said storage device being configured to, after volatile memory in said storage device losing data due to loss of power to said volatile memory:
   receive another filtered data block request; and
   to perform region pruning for said another filtered data block request, use entries in said summary that were stored in said NVRAM before said loss of power.

16. The storage device of claim 13, said storage device being configured to use entries in said summary by accessing said at least one entry in place after said updating in place within said NVRAM said at least one entry.

17. The storage device of claim 13, wherein said one or more criteria for updating the summary includes that no rows in said first region of said plurality of regions satisfy said one or more filtering criteria.

18. The storage device of claim 13, wherein said summary indicates at least one of a max value and min value in a column stored in at least some of said plurality of regions.

* * * * *

UNITED STATES PATENT AND TRADEMARK OFFICE
CERTIFICATE OF CORRECTION

PATENT NO. : 11,775,527 B2
APPLICATION NO. : 17/356827
DATED : October 3, 2023
INVENTOR(S) : Meiyyappan et al.

Page 1 of 2

It is certified that error appears in the above-identified patent and that said Letters Patent is hereby corrected as shown below:

On the Title Page

Column 2, under Other Publications, Line 2, delete "Action." and insert -- Action, dated Nov. 13, 2020. --, therefor.

In the Drawings

On sheet 3 of 5, in FIG. 3, under Reference Numeral 315, Line 2, delete "superceds" and insert -- supersede --, therefor.

On sheet 3 of 5, in FIG. 3, under Reference Numeral 315, Line 3, delete "superceded" and insert -- superseded --, therefor.

In the Specification

In Column 2, Line 35, delete "Cl" and insert -- C1 --, therefor.

In Column 2, Line 38, delete "Cl" and insert -- C1 --, therefor.

In Column 2, Line 40, delete "Cl" and insert -- C1 --, therefor.

In Column 3, Line 26, delete "The Summaries are referred to".

In Column 3, Line 35, delete "Cl" and insert -- C1 --, therefor.

In Column 3, Line 41, delete "Cl." and insert -- C1. --, therefor.

In Column 3, Line 44, delete "Cl" and insert -- C1 --, therefor.

In Column 3, Line 45, delete "Cl" and insert -- C1 --, therefor.

Signed and Sealed this
Twenty-fifth Day of June, 2024

Katherine Kelly Vidal
*Director of the United States Patent and Trademark Office*

CERTIFICATE OF CORRECTION (continued)
U.S. Pat. No. 11,775,527 B2

In Column 4, Line 32, delete "processer" and insert -- processor --, therefor.

In Column 5, Line 61, delete "rol" and insert -- col --, therefor.

In Column 7, Line 41, delete "NRVAM" and insert -- NVRAM --, therefor.

In Column 8, Line 22, delete "Coherance" and insert -- Coherence --, therefor.

In the Claims

In Column 16, Line 53, in Claim 5, delete "data blocks" and insert -- said plurality of regions --, therefor.